(12) United States Patent
Fujisawa et al.

(10) Patent No.: US 6,395,973 B2
(45) Date of Patent: May 28, 2002

(54) PHOTOVOLTAIC DEVICE

(75) Inventors: Akira Fujisawa; Hodaka Norimatsu; Masahiro Hirata, all of Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 0 days.

(21) Appl. No.: 09/791,843

(22) Filed: Feb. 23, 2001

Related U.S. Application Data

(63) Continuation of application No. PCT/JP99/04610, filed on Aug. 26, 1999.

(30) Foreign Application Priority Data

Aug. 26, 1998 (JP) ............................................. 10-239699

(51) Int. Cl.⁷ ........................ H01L 31/04; H01L 31/048
(52) U.S. Cl. ...................... 136/256; 136/257; 136/258; 136/251; 257/53; 257/434; 257/433; 257/432
(58) Field of Search ................................ 136/256, 257, 136/258 AM, 251; 257/53, 434, 433, 432

(56) References Cited

U.S. PATENT DOCUMENTS

| | | |
|---|---|---|
| 4,377,613 A | 3/1983 | Gordon |
| 4,940,495 A | 7/1990 | Weber et al. |
| 5,449,413 A | 9/1995 | Beauchamp et al. |

FOREIGN PATENT DOCUMENTS

| | | |
|---|---|---|
| JP | 58-074087 | 5/1983 |
| JP | 60-142576 | 7/1985 |
| JP | 62-213283 | 9/1987 |
| JP | 2-168507 | 6/1990 |
| JP | 2-168507 A * | 6/1990 |
| JP | 2-181473 | 7/1990 |
| JP | 7-007168 | 1/1995 |

\* cited by examiner

*Primary Examiner*—Alan Diamond
(74) *Attorney, Agent, or Firm*—Merchant & Gould P.C.

(57) ABSTRACT

A photovoltaic device comprising a transparent substrate, a transparent conductive film, a semiconductor thin film, and a metallic electrode film, the three film being formed on one side of the substrate. The distribution of thickness of the transparent conductive film is within a range of +/−10% of the center thickness. A transparent thin film including at least one layer is formed between the transparent substrate and the transparent conductive film. The colors a* and b* of light reflected from the transparent substrate on which the light is incident vary in the range of +/−5 of the colors a* and b*.

25 Claims, No Drawings

US 6,395,973 B2

PHOTOVOLTAIC DEVICE

This application is a continuation of international application number PCT/JP99/04610, filed Aug. 26, 1999.

TECHNICAL FIELD

The present invention relates to a photovoltaic device having a transparent conductive films disposed on a surface of a transparent substrate to which light is applied, a photoelectric conversion active layer of amorphous silicon disposed on the transparent conductive film, and a metallic electrode film disposed on the photoelectric conversion active layer.

BACKGROUND ART

In recent years, there have been a growing demand for energies, particularly an electric energy. New power plants for thermal electric power generation which consumes petroleum and coal are not easy to construct in view of the exhaustion of raw fuels in the future, and new power plants for nuclear electric power generation which consumes uranium or the like are not easy to construct either in view of environmental problems at issue today.

It has been studied by governments to make up for a power shortage with new energies including electric power generation based on solar energy. In Japan where available land is limited, it has been mainly planned to generate electric power from solar energy with solar cells that are mounted on house roofs and walls. Solar cells for generating electric power have been made of crystalline silicon or polycrystalline silicon so far. Mass-production of such solar cells poses a problem in that silicon as a raw material will suffer a shortage. For this reason, research efforts are being directed to amorphous silicon solar cells which consume less raw material of silicon than crystalline silicon solar cells or polycrystalline silicon solar cells.

Heretofore, many amorphous silicon solar cells have been used as power supplies for calculators and watches. Since solar cells for these devices may be of a small area, reflected interference color irregularities (hereinafter referred to as "reflected color irregularities") caused due to a thickness distribution of thin films (hereinafter referred to as "film thickness irregularities") of solar cells has not posed a significant problem.

However, solar cells mounted on house roofs and walls take up a large area. Since those solar cells still suffer aesthetic problems such as reflected color irregularities, they need to be improved to make themselves more commercially attractive. Presently available large-area amorphous silicon solar cells are not highly commercially attractive because of the problem of reflected color irregularities that are caused by film thickness irregularities of a transparent conductive film made of tin oxide, for example, which is a component thereof.

If a transparent conductive film made of tin oxide, for example, has no film thickness irregularities, then no problem of reflected color irregularities arises in principle. According to the actual industrial production practice, however, it is difficult to produce transparent conductive films free of film thickness irregularities inexpensively in view of film thickness irregularities. Reflected colors of present large-area amorphous silicon solar cells are only in a range from red to reddish purple, and hence a choice of colors for such solar cells is limited.

Known processes of manufacturing amorphous silicon solar cells with a controlled reflected color tone include a process of growing a transparent conductive film and then etching it to a desired thickness as disclosed in Japanese laid-open patent publication No. 58-74087 and a process of forming a wedge-shaped thin film of irregular thickness on the reverse side of a substrate as disclosed in Japanese laid-open patent publication No. 60-142576. According to a process of controlling a reflected color tone of a glass substrate with a transparent conductive film formed thereon, as disclosed in Japanese patent publication No. 3-72586, a layer of high refractive index is formed on a substrate, and a layer of lower refractive index than the layer of high refractive index is formed thereon, producing a two-layer film, which is formed beneath an infrared-reflective transparent semiconductor that is a transparent conductive film.

The process of growing a transparent conductive film and then etching it to a desired thickness as disclosed in Japanese laid-open patent publication No. 58-74087 does not indicate specific details of the control of an etched amount. The process not only makes it difficult to control the film thickness, but also suffers poor productivity as the thin film once grown is etched.

The process of forming a wedge-shaped thin film of irregular thickness on the reverse side of a substrate as disclosed in Japanese laid-open patent publication No. 60-142576 uses a rainbow-color pattern. Therefore, if produced solar cells are used on house roofs, then they pose an aesthetic problem, and also suffer difficulty in forming a wedge-shaped thin film of irregular thickness and a reduction in productivity.

Japanese patent publication No. 3-72586 discloses nothing as to a reflected color tone produced if an amorphous silicon film is formed on a transparent conductive film and then a metallic film such as of aluminum is formed on the amorphous silicon film. Therefore, it is difficult to infer what a reflected color tone would be like with such a structure, and a desired color tone may not necessarily be obtained.

A photovoltaic device according to the present invention solves the above deficiencies of the prior art, and suffers less reflected color irregularities when used on house roofs and walls, exhibits a reflected color including at least one of a neutral color and a greenish color, thus making highly aesthetic house roofs and walls on which the photovoltaic device is mounted, and can be produced with excellent productivity.

DISCLOSURE OF INVENTION

The present invention has been made in order to solve the above problems. An invention described in claim 1 is a photovoltaic device comprising a transparent conductive film, a semiconductor thin film, and a metallic electrode film successively deposited on one surface of a transparent substrate, characterized in that the thickness distribution of the transparent conductive film is in a range of ±10% of a central film thickness, a transparent thin film comprising at least one layer is deposited between the transparent substrate and the transparent conductive film, and a* and b* of a reflected color from the transparent substrate to which light is applied may vary within a range of ±5 of a* and b*.

According to an invention described in claim 2, in the invention described in claim 1, the transparent thin film has a refractive index ranging from 1.45 to 1.8 and a thickness ranging from 20 to 80 nm.

According to an invention described in claim 3, in the invention described in claim 2, the transparent thin film is primarily made of silicon oxide or aluminum oxide.

According to an invention described in claim 4, in the invention described in claim 1, the transparent thin film comprises a first layer and a second layer, the first layer thin film positioned closer to the transparent substrate has a refractive index ranging from 1.8 to 2.5 and a thickness ranging from 10 to 50 nm, and the second layer thin film deposited on the first layer thin film has a refractive index ranging from 1.45 to 1.8 and a thickness ranging from 10 to 50 nm.

According to an invention described in claim 5, in the invention described in claim 4, the first layer thin film is primarily made of tin oxide or titanium oxide, and the second layer thin film is primarily made of silicon oxide or aluminum oxide.

According to an invention described in claim 6, in the invention described in any one of claims 1 through 5, the transparent conductive film has a thickness smaller than 800 nm.

According to an invention described in claim 7, in the invention described in claim 1, the transparent conductive film has a thickness ranging from 800 to 1500 nm.

An invention described in claim 8 is a photovoltaic device comprising a transparent conductive film, a semiconductor thin film, and a metallic electrode film successively deposited on one surface of a transparent substrate, characterized in that a transparent thin film comprising at least one layer is deposited between the transparent substrate and the transparent conductive film, and a reflected color as seen from the transparent substrate to which light is applied includes at least one of a neutral color and a greenish color.

According to an invention described in claim 9, in the invention described in claim 8, the transparent thin film has a refractive index ranging from 1.45 to 2.5 and a thickness ranging from 15 to 100 nm.

According to an invention described in claim 10, in the invention described in claim 9, the transparent thin film is primarily made of silicon oxide, aluminum oxide, tin oxide, or titanium oxide.

According to an invention described in claim 11, in the invention described in claim 8, the transparent thin film comprises a first layer and a second layer, the first layer thin film positioned closer to the transparent substrate has a refractive index ranging from 1.8 to 2.5 and a thickness ranging from 15 to 100 nm, and the second layer thin film deposited on the first layer thin film has a refractive index ranging from 1.45 to 1.8 and a thickness ranging from 15 to 100 nm.

According to an invention described in claim 12, in the invention described in claim 11, the first layer thin film is primarily made of tin oxide or titanium oxide, and the second layer thin film is primarily made of silicon oxide or aluminum oxide.

According to an invention described in claim 13, in the invention described in any one of claims 1 through 12, the transparent conductive film is primarily made of tin oxide.

According to an invention described in claim 14, in the invention described in claim 13, the transparent conductive film contains at least one of fluorine, chlorine, or antimony.

According to an invention described in claim 15, in the invention described in claim 14, the transparent conductive film contains 0.11 weight % or less of chlorine and fluorine having a concentration equal to or greater than the concentration of chlorine.

According to an invention described in claim 16, in the invention described in claim 15, the concentration of chlorine in the transparent conductive film ranges from 0.005 to 0.11 weight % and the concentration of fluorine thereof ranges from 0.01 to 0.7 weight %.

According to an invention described in claim 17, in the invention described in any one of claims 1 through 16, a transparent film of at least one layer is formed on a surface of the transparent substrate remote from the transparent conductive film, and the reflectivity of the transparent substrate closer to the transparent conductive film is smaller than the reflectivity of the transparent substrate which is free of the transparent film, in the absence of the semiconductor thin film and the metallic electrode film.

According to an invention described in claim 18, in the invention described in claim 17 the transparent film has a refractive index ranging from 1.25 to 1.35 and a thickness ranging from 50 to 200 nm or a refractive index ranging from 1.35 to 1.50 and a thickness ranging from 45 to 190 nm.

According to an invention described in claim 19, in the invention described in claim 17, the transparent film comprises a two-layer film, and the refractive index of the transparent film closer to the transparent substrate is greater than the refractive index of the transparent film formed thereon.

According to an invention described in claim 20, in the invention described in claim 19, the transparent film closer to the transparent substrate has a refractive index ranging from 1.6 to 2.0 and a thickness ranging from 50 to 200 nm, and the transparent film formed thereon has a refractive index ranging from 1.25 to 1.8 and a thickness ranging from 30 to 150 nm.

According to an invention described in claim 21, in the invention described in any one of claims 1 through 20, the semiconductor thin film contains amorphous silicon.

Briefly summarized, the photovoltaic device according to the present invention is characterized in that reflected color irregularities are eliminated and a reflected color includes at least one of a neutral color and a greenish color by controlling the thickness of the transparent thin film grown as a silicon oxide film, a tin oxide film, a titanium oxide film, an aluminum oxide film, or the like on the glass substrate and also controlling the thickness of the transparent conductive film.

Specifically, by forming the transparent thin film of one or more layers, whose refractive index and thickness have been adjusted, between the transparent conductive film and transparent substrate, forming the thin film on the other surface of the transparent substrate remote from the transparent conductive film, and further controlling the thickness of the transparent conductive film, the photovoltaic device is free of reflected color irregularities, exhibits a reflected color including at least one of a neutral color and a greenish color, and can be manufactured with excellent productivity.

The neutral color and the greenish color referred herein are represented by:

neutral color: $-5<a^*<+5$, $-5<b^*<+5$ greenish color: $-30<a^*<-5$, $-5<b^*<+5$ where $a^*$ and $b^*$ indicate chromaticness indexes in $L^*a^*b^*$ colorimetric system provided for according to JIS Z 8729-1980.

BEST MODE FOR CARRYING OUT THE INVENTION

The present invention will hereinafter be described in detail below.

A photovoltaic device according to a first embodiment of the present invention will be described below. The photovoltaic device according to the first embodiment is represented by claims 1–7, claims 13–16, and claim 21.

Film thickness irregularities which cause reflected color irregularities are a problem related to any films that make up an amorphous silicon solar cell. A transparent thin film formed between a transparent substrate and a transparent conductive film has a small effect on reflected color irregularities because its thickness is smaller than the transparent conductive film. Since film thickness distribution irregularities of an amorphous silicon layer grown by a plasma CVD process are small, they also have a small effect on reflected color irregularities. Furthermore, a metallic thin film of aluminum or the like also has a small effect on reflected colors of amorphous silicon solar cells as its film thickness irregularities are small. Therefore, the thickness distribution of the transparent conductive firm has the greatest effect on reflected color irregularities in amorphous silicon solar cells.

If the thickness distribution of the transparent conductive film exceeded a range of ±10% of the central film thickness, then reflected color irregularities would be conspicuous due to a light interference effect. Therefore, the thickness distribution needs to be kept within the range of ±10% of the central film thickness. The central film thickness is indicated by $(\delta max + \delta min)/2$ where $\delta max$ is the maximum film thickness and $\delta min$ is the minimum film thickness.

From the standpoints of economy and productivity, a CVD process is excellent as a process of forming a transparent conductive film. However, transparent conductive films produced by the CVD process tend to have large thickness distribution irregularities if their thickness is large. In order to reduce reflected color irregularities caused by film thickness irregularities of transparent conductive films, a transparent thin film of one layer or more whose refractive index and thickness have been adjusted is disposed between the transparent substrate and the transparent conductive film.

The reasons why reflected color irregularities are reduced and reflected colors are obtained as a neutral color and a greenish color according to the present invention are that a light interference effect due to a multilayer thin film is adjusted by providing at least one layer whose refractive index and film thickness have been adjusted between the transparent substrate and the transparent conductive film, in addition to a transparent conductive film layer, an amorphous silicon layer, and a metallic film layer.

For adjusting the refractive index and thickness of the transparent thin film disposed between the transparent substrate and the transparent conductive film, the thickness of the transparent conductive film may be less than 800 nm. If the thickness of the transparent conductive film is equal to or greater than 800 nm, then almost no adjustment may be made to the refractive index and thickness of the transparent thin film disposed between the transparent substrate and the transparent conductive film. This is because the large thickness reduces an interference effect of visible rays, reducing reflected color irregularities.

If the film thickness were greater than 1500 nm, then the manufacturing cost would be increased due to an increase in the raw material, and the film growth rate would be lowered and the film growth time would be increased, resulting in a reduction in productivity and an increase in the manufacturing cost.

While the transparent substrate may be made of transparent resin or the like, it should preferably be made of glass from the standpoints of fire resistance, durability, and shock resistance if the solar cell is used on house roofs or the like.

In the transparent thin film according to the first embodiment, a thin film having a refractive index ranging from 1.45 to 1.8 for use as a single-layer film or a second-layer thin film of a two-layer film may comprise silicon oxide film, silicon oxide film containing carbon and nitrogen, aluminum oxide film or a metal oxide thin film primarily made of silicon or aluminum. For easy film growth, silicon oxide, silicon oxide containing carbon and nitrogen, or aluminum oxide is preferable if a CVD process, described later on, is employed.

In the transparent thin film according to the first embodiment, a thin film having a refractive index ranging from 1.8 to 2.5 for use as a first-layer thin film of the two-layer film may be made of tin oxide, indium oxide, zinc oxide, or titanium oxide. If a CVD process is employed, then tin oxide or titanium oxide is preferable as they can easily be obtained, can easily produce films, and are relatively inexpensive raw materials. To tin oxide, there may be added fluorine, chlorine, or antimony.

If the thicknesses of these thin films were too small, then they could not be uniformly grown on the transparent substrate, failing to reduce reflected color irregularities. If the thicknesses of these thin films were too large, then a large amount of raw material would be required, the manufacturing cost would be increased, the film grow rate would be reduced, the film growth time would be increased, the productivity would be reduced, and the manufacturing cost would be increased.

If the transparent thin film for reducing reflected color irregularities comprises a single-layer film, then the thickness of the single-layer film is preferably in the range from 20 to 80 nm. If the transparent thin film comprises a film of two or more layers, then the thickness of each of the layers is preferably in the range from 10 to 50 nm.

The transparent conductive film may be made of tin oxide with fluorine, chlorine or antimony added thereto, indium oxide with tin added thereto, or zinc oxide with aluminum or indium added thereto. The transparent conductive film should preferably be made of a material primarily composed of tin oxide in view of the problem of a film growth material in the CVD process, or more preferably be made of tin oxide containing at least one selected from fluorine, chlorine, and antimony.

If the concentration of chlorine in the transparent conductive film is equal to or less than 0.11 weight % and the concentration of fluorine in the transparent conductive film is equal to or greater than the concentration of chlorine in the transparent conductive film, then the refractive index of the transparent conductive film is adjusted to reduce reflected color irregularities in combination with the effect of the transparent thin film formed between the transparent substrate and the transparent conductive film.

With the adjusted refractive index, the film thickness may be optimized to achieve a neutral color or a greenish color as a reflected color.

Preferably, the concentration of chlorine ranges from 0.005 to 0.11 weight %, and the concentration of fluorine ranges from 0.01 to 0.7 weight %. More preferably, the concentration of fluorine ranges from 0.01 to 0.30 weight %. If the concentration of chlorine were less than 0.005 weight % and the concentration of fluorine were less than 0.01 weight %, then the refractive index would not essentially be changed, producing no effect on reflected color irregularities. If the concentration of chlorine exceeded 0.11 weight % or the concentration of fluorine exceeded 0.30 weight %, then the absorption of wavelengths of light effective for solar cells would be increased, reducing the amount of light applied to amorphous silicon and hence reducing the conversion efficiency of the photovoltaic device.

Processes of forming the transparent thin film and the transparent conductive film include physical processes including a vacuum evaporation process, a sputtering process and an ion plating process using various metals and metal oxides, and chemical processes including a chemical vapor deposition (CVD) process for applying a gaseous vapor of metal compound to a heated glass substrate to grow a film thereon, a spray process for applying droplets of a solution containing metal compound dissolved therein to a heated glass substrate, and a powder spray process for spraying a powder of metal compound.

Film growth according to the physical processes is excellent with respect to film thickness uniformity, but has mass-production difficulty because a cut glass substrate is cleaned and a film is grown thereon in a vacuum apparatus. The chemical processes are better than the physical processes because they can handle glass substrates of larger sizes.

Of the chemical processes, the spray process allows a film to be grown inexpensively as it is simple. However, the spray process cannot achieve film thickness uniformity because it is difficult to control droplets to be applied to the glass substrate and to control reaction products and products to be discharged such as undecomposed products. The spray process is also disadvantageous in that the glass is subject to an increased strain. Therefore, the comparison between the CVD process and the spray process indicates that the CVD process is more suitable as a process of manufacturing the transparent conductive film and the transparent thin film.

For forming metal oxide films according to the CVD process, it is the general practice to heat a glass substrate cut to a square size with each side 500 mm long, and apply a gaseous metal compound to the heated glass substrate to grow a film thereon. Recently, if a glass substrate with a transparent conductive film where various thin films are formed is used in amorphous solar cells on house roofs, there is a need for an increased size of such a glass substrate.

When a glass substrate cut to a large area is heated and a gaseous metal compound is applied to the heated glass substrate to grow a film thereon, a large amount of heat energy is required to heat the glass substrate. For producing a large-area glass substrate with a transparent conductive film formed thereon, it is desirable to continuously grow the film on a high-temperature glass ribbon according to the CVD process, utilizing the heat energy applied when the glass substrate is formed, from the viewpoints of manufacturing cost and quality.

Raw materials of the transparent thin film and the transparent conductive film will be described below.

Aluminum materials for aluminum oxide include trimethyl aluminum, aluminum triisopropoxide, diethyl aluminum chloride, aluminum acethylacetonate, and aluminum chloride.

Titanium materials for titanium oxide formed by the CVD process include titanium tetrachloride and titanium isopropoxide.

Tin compound materials used in the CVD process include tin tetrachloride, dimethyl tin dichloride, dibutyl tin dichloride, tetrabutyl tin, tetramethyl tin, dioctyl tin dichloride, and monobutyl tin trichloride. Oxidizing agents for obtaining tin oxide include oxygen, water vapor, dry air, etc.

In the transparent conductive film, fluorine is added in the form of hydrogen fluoride, trifluoroacetate, bromotrifluoromethane, or chlorodifluoromethane, and antimony in the form of pentachloride antimoney or trichloride antimoney in order to increase the electric conductivity of tin oxide.

In order to improve various characteristics, there may be added, in addition to the above fluorine and antimony compounds, silicon, aluminum, zinc, copper, indium, bismuth, gallium, boron, vanadium, manganese, zirconium, etc. in such a range that does not greatly reduce the electric conductivity of the transparent conductive film.

The transparent thin film such as a silicon oxide film, an aluminum oxide film, or the like which is formed between a tin oxide film as the transparent conductive film and the transparent substrate also serves (as a so-called alkali barrier layer) to prevent sodium in the glass from entering the transparent conductive film, which comprises the tin oxide film, to lower its electric conductivity.

Silicon materials of the silicon oxide formed by the CVD process include monosilane, disilane, trisilane, monochlorosilane, dichlorosilane, 1,2-dimethylsilane, 1,1,2-trimethylsilane, 1,1,2,2-tetramethyldisilane, and the oxidizing agents include oxygen, water vapor, dry air, carbon dioxide, carbon monoxide, nitrogen dioxide, etc.

An unsaturated hydrocarbon gas such as ethylene, acetylene, toluene, or the like may be added for the purpose of preventing oxidization up to the glass surface if silane is used and also controlling the refractive index of the produced silicon oxide film.

The amorphous silicon film used as the semiconductor thin film will be described below.

A plasma CVD process using a plasma energy is generally employed as a process of forming the amorphous silicon film. Monosilane, disilane, etc. are generally used as materials for growing the film according to the plasma CVD process.

For producing an amorphous silicon solar cell, it is necessary to provide p-type and n-type semiconductor layers of amorphous silicon. To produce a p-type semiconductor layer, it is customary to add diborane or the like to monosilane or the like. To produce an n-type semiconductor layer, it is customary to add phosphine or the like.

In addition to the amorphous silicon layer as the semiconductor thin film, it is more preferable to form an oxide semiconductor thin film such as of zinc oxide or the like for the purpose of reducing reflected color irregularities and adjusting the reflected color.

The metallic electrode film formed on the amorphous silicon film or the zinc oxide film is generally made of aluminum, silver, or the like. These metallic electrode films may generally be formed by a physical process such as a vacuum evaporation process and a sputtering process, or the like using a metallic target.

A photovoltaic device according to a second embodiment of the present invention will be described below with respect to parts different from those of the first embodiment. The photovoltaic device according to the second embodiment is represented by claims 8–16 and claim 21. According to the second embodiment, a reflected color as seen from the transparent substrate to which light is applied includes at least one of a neutral color and a greenish color.

The reasons why such a reflected color is obtained are that a light interference effect due to a multilayer thin film is adjusted by providing at least one layer whose refractive index and film thickness have been adjusted between the transparent substrate and the transparent conductive film, in addition to a transparent conductive film layer, an amorphous silicon layer, and a metallic film layer, as described above.

In the transparent thin film according to the second embodiment, for easy film growth, a thin film having a refractive index ranging from 1.45 to 2.5 for use as a single-layer film should preferably be made of silicon oxide, aluminum oxide, tin oxide, or titanium oxide, if CVD process is employed. Silicon oxide may contain carbon and nitrogen, and tin oxide may contain fluorine, chlorine, or antimony.

In the transparent thin film according to the second embodiment, a thin film having a refractive index ranging from 1.8 to 2.5 for use as a first-layer thin film of a two-layer film may be made of tin oxide, indium oxide, zinc oxide, or titanium oxide. For easy film growth in the CVD process, zinc oxide or titanium oxide is preferable similarly to the first embodiment. A thin film having a refractive index ranging from 1.45 to 1.8 for use as a second-layer thin film of the two-layer film should preferably be made of silicon oxide or aluminum oxide similarly to the first embodiment.

If the transparent thin film comprises a single-layer film or a film of two or more layers, then the thickness of each layer is preferably in the range from 15 to 100 nm.

A photovoltaic device according to a third embodiment of the present invention will be described below with respect to parts different from those of the first and second embodiments. The photovoltaic device according to the third embodiment is represented by claims 17–20. According to the third embodiment, in the photovoltaic device according to the first or second embodiment, a reflection reducing layer comprising a transparent film of at least one layer is formed on the surface of the transparent substrate remote from the transparent conductive film. The reflectivity of the surface of the transparent substrate remote from the transparent conductive film is thus lowered, resulting in a reduction of reflected color irregularities.

The reflection reducing layer may comprise a multilayer film of two or more layers. In this case, it is necessary to adjust the film thickness matching the refractive index of each film layer of the multilayer film.

The reflection reducing layer should preferably have a thickness ranging from 50 to 200 nm if it comprises a single-layer film having a refractive index substantially ranging from 1.25 to 1.35. The reason for the thickness is that if the thickness were smaller than 50 nm, then the reflection reducing layer has almost no reflection reducing capability, and if the thickness were greater than 200 nm, then any reflection reducing capability at wavelengths of light effective for solar cells would be reduced, the productivity would be lowered, and the manufacturing cost would be increased.

If the reflection reducing layer comprises a single-layer film having a refractive index substantially ranging from 1.35 to 1.50, then the thickness thereof ranges from 45 to 190 nm. The upper and lower limits of the thickness are given for the same reasons as those described above. Since the refractive index of this single-layer film is greater than the above single-layer film, the preferable film thickness range is slightly lower than the preferable film thickness range of the above single-layer film.

The transparent film whose refractive index ranges from 1.25 to 1.35 is primarily made of porous silicon oxide, and the transparent film whose refractive index ranges from 1.35 to 1.50 is also primarily made of porous silicon oxide whose porosity is different from the above porous silicon oxide or silicon oxide.

The reflection reducing layer may comprise a multilayer film of two or more layers. In this case, in order to reduce reflectivity it is preferable that the refractive index of the transparent film near the transparent substrate be greater than the refractive index of the transparent film formed thereon.

It is necessary to adjust the film thickness matching the refractive index of each of the transparent films. The transparent film should preferably have a refractive index ranging from 1.6 to 2.0 and a thickness ranging from 50 to 200 nm, and the transparent film formed thereon preferably have a refractive index ranging from 1.25 to 1.8 and a thickness ranging from 30 to 150 nm.

The transparent film whose refractive index ranges from 1.6 to 2.0 comprises a film made primarily of titanium oxide, tin oxide, aluminum oxide, or silicon oxide, or a film of a mixture of these oxides. The transparent film whose refractive index ranges from 1.25 to 1.8 comprises a film made primarily of one of the above oxides, particularly silicon oxide or aluminum oxide, or a film of a mixture of the above oxides where silicon oxide and aluminum oxide have large proportions, or a film of porous silicon oxide or the like.

As described above, the photovoltaic device according to the present invention comprises a glass substrate, a transparent thin film in the form of a silicon oxide film, a tin oxide film, a titanium oxide film, or the like deposited on the glass substrate according to the CVD process, a tin oxide film deposited as a transparent conductive film on the transparent thin film, an amorphous silicon film or a zinc oxide film on an amorphous silicon film formed as a semiconductor thin film on the tin oxide film, and an aluminum film deposited as a metallic electrode film. Furthermore, a reflection reducing layer comprising a transparent film of at least one layer is formed on the surface of the transparent substrate remote from the transparent conductive film in the above device.

EXAMPLES

The present invention will be described in greater detail below with respect to inventive and comparative examples.

(Inventive Examples 1–2, Inventive Example 14, Inventive Example 17)

Ordinary soda lime silica glass was melted in a smelting furnace, the melted material was poured into a tin tank, and a sheet of glass was formed according to a so-called floating process. The thickness of the sheet of glass was adjusted to 3 mm. An atmospheric gas in the tin tank was composed of 98 volume % of nitrogen and 2 volume % of hydrogen, and had a pressure that was a slightly positive pressure with respect to the surrounding pressure.

When the sheet of glass was passed below a plurality of front film growing nozzles in the tin tank, it was treated with a mixed gas of monosilane, ethylene, oxygen, and nitrogen. At this time, a transparent thin film made primarily of silicon oxide was formed.

When the sheet of glass was passed below a plurality of rear nozzles, it was treated with a mixed gas of a vapor of dimethyl tin dichloride, oxygen, water vapor, nitrogen, and hydrogen fluoride. At this time, a transparent conductive film of tin oxide was formed on the silicon oxide film. The thickness of each of the films was controlled by changing the concentration of the material used. The sheet of glass was then annealed and then cut to a glass panel having dimensions of 450 mm×450 mm.

Then, the glass panel with the tin oxide film formed thereon was sufficiently washed and dried. Thereafter, using a mixed gas of hydrogen, a monosilane gas, etc., an amorphous silicon thin film was formed under a pressure of about 170 Pa by a capacitance-coupled high-frequency glow discharge apparatus, thus producing an amorphous silicon solar cell. The amorphous silicon solar cell was of the following structure:

| p layer | a-SiC:H | 10 nm |
|---|---|---|
| | Materials: monosilane, methane, diborane | |
| i layer | a-Si:H | 300–550 nm |
| | Materials: monosilane | |
| n layer | μc-Si:H | 40 nm |
| | Materials: monosilane, phosphine | |

The temperature of the above glass substrate was 220° C.

The thickness of the amorphous silicon film was controlled based on a film growth time.

On the amorphous silicon film thus formed, there was formed an Al layer as a reverse-side electrode to a thickness of about 300 nm under the pressure of $10^{-4}$ Pa, thus producing a solar cell. The glass panel was cut to a size of 430 mm×430 mm. In Inventive Examples 3–13, 15, 16, 18–39 and Comparative Examples 1–7, amorphous silicon solar cells were fabricated according to the above process.

In growing the transparent thin film and the transparent conductive film, at about the time when these multilayer films are formed, only single-layer films are formed, and the refractive index and thickness of the transparent thin film and the thickness distribution of the transparent conductive film were determined according to the following process:

The refractive index of the silicon oxide film as the transparent thin film was determined at a wavelength of 633 nm by ellipsometry (the refractive indexes of aluminum oxide, tin oxide, and titanium oxide as the transparent thin film were also determined according to the same process).

The thickness of the silicon oxide film was determined with its extinction coefficient set to 0 at the time the refractive index thereof was measured by ellipsometry. The thickness of the aluminum oxide film was also determined according to the same process.

The thickness of the tin oxide film as the transparent thin film was determined by applying a powder of zinc to a tin oxide film masked by a tape, pouring dilute hydrochloric acid onto the tin oxide film to etch the same, and using a surface profiler. The titanium oxide film as the transparent thin film was determined according to the same process.

The thickness distribution of the tin oxide film as the transparent conductive film was determined by selecting several spots where reflected colors are different from the glass surface with the film deposited thereon, and measuring film thicknesses in the spots using the same surface profiler as described above. The results are shown in Table 1 for Inventive Examples 1–2, 14 and in Table 2 for Inventive Example 17. Inventive Examples 3–13, 15, 25–36 and Comparative Examples 1–7 were also measured according to this process, and the results are shown in Table 1. Inventive Examples 16, 18–24, 37–39 were also measured according to this process, and the results are shown in Table 2.

Visible-light reflected colors of the produced amorphous silicon solar cells were measured by the 330-type spectrophotometer manufactured by Hitachi according to JIS Z 8722-1982, and values shown in Table 1 were determined by chromaticness indexes $a^*$, $b^*$ in $L^*a^*b^*$ colorimetric system provided for according to JIS Z 8729-1980. Maximum and minimum values of distributed values of $a^*$, $b^*$ were measured at positions where reflected colors are different in the surfaces of the amorphous silicon solar cells, and the measured results are shown in Table 1. Inventive Examples 3–13, 15, 25–36 and Comparative Examples 1–7 were also measured according to this process, and the calculated results are shown in Table 1.

Whether reflected color irregularities are present or not and reflected colors were visually determined by holding the produced amorphous silicon solar cell samples vertically against a white wall with their surfaces remote from the deposited films being on the face sides, applying light to the face sides, and viewing them from a position spaced 1 m away. The results are shown in Table 1 and Table 2. Inventive Examples 3–13, 15, 16, 18–39 and Comparative Examples 1–7 were also determined according to this process.

The concentrations of chlorine and fluorine in the transparent conductive films were calculated from the intensity of characteristic X rays of an electron beam microanalyzer, and the results are shown in Table 3. Inventive Examples 3–13, 15, 16, 18–39 and Comparative Examples 1–7 were also measured and calculated according to this process.

(Inventive Example 3, Inventive Examples 12–13)

An ordinary soda lime silica glass panel having a thickness of about 1 mm which was cut to a size of 450 mm×450 mm was placed on a mesh belt and heated to about 570° C. by passing through a heating furnace.

The glass panel was passed below a first film growing nozzle, and was treated with a mixed gas of monosilane, oxygen, and nitrogen. At this time, a transparent thin film made primarily of silicon oxide was formed. The glass panel with the thin film form thereon was annealed and taken out, and thereafter placed on a mesh belt and heated to about 600° C. by passing through a heating furnace. Thereafter, the glass panel was passed below a plurality of film growing nozzles, and treated with a mixed gas of a vapor of monobutyl tin trichloride, oxygen, water vapor, nitrogen, and trifluoroacetate. At this time, a transparent conductive film of tin oxide was formed on the silicon oxide film. The thickness of each of the films was controlled by changing the concentration of the material used.

Using the produced glass substrate, an amorphous solar cell was fabricated according to the same process as with Inventive Example 1. After it was cut to a size of 430 mm×430 mm, it was evaluated in the same manner as with Inventive Example 1. The results are shown in Table 1.

(Inventive Examples 4–5)

A glass panel of the same dimensions and material as with Inventive Example 3 was treated with a mixed gas of aluminum isopropoxide, oxygen, and nitrogen, rather than a mixed gas of monosilane, to form a transparent thin film made primarily of aluminum oxide on the glass panel. A subsequent process is the same as the process after the formation of the silicon oxide film in Inventive Example 3. The glass panel was annealed, taken out, and reheated to 600° C., after which a transparent conductive film of tin oxide was formed on the transparent thin film of aluminum oxide using a mixed gas of a vapor of monobutyl tin trichloride, etc.

Then, an amorphous solar cell was fabricated according to the same process as with Inventive Example 1, and evaluated in the same manner as with Inventive Example 1. The results are shown in Table 1.

(Inventive Examples 6–7, Inventive Examples 25–27)

A glass panel of the same material and by the same manufacturing method as with Inventive Example 1 was treated with a mixed gas of a vapor of dimethyl tin dichloride, oxygen, water vapor, helium, and nitrogen to form a film of tin oxide on the glass panel according to the same process as with Inventive Example 1. A subsequent process is the same as with Inventive Example 1. A film of silicon oxide was formed on the above film, using a mixed gas of monosilane, thereby forming a transparent thin film of two layers. Using a mixed gas of a vapor of dimethyl tin dichloride, etc., a transparent conductive film of tin oxide was formed on the above film.

Then, the glass panel with these films formed thereon was cut to fabricate an amorphous solar cell according to the same process as with Inventive Example 1, and evaluated in the same manner as with Inventive Example 1 The results are shown in Table 1.

(Inventive Example 8)

A glass panel of the same dimensions and material as with Inventive Example 3 was treated with a mixed gas of a vapor of monobutyl tin trichloride, oxygen, water vapor, and nitrogen to form a film of tin oxide on the glass panel. A subsequent process is the same as with Inventive Example 3. A film of silicon oxide was formed on the above film, using a mixed gas of monosilane, thereby forming a transparent thin film of two layers. The glass panel was annealed, taken out, and reheated to 600° C., after which a transparent conductive film of tin oxide was formed on the film of silicon oxide, using a mixed gas of a vapor of monobutyl tin trichloride, etc.

Then, an amorphous solar cell was fabricated according to the same process as with Inventive Example 1, and evaluated in the same manner as with Inventive Example 1. The results are shown in Table 1.

(Inventive Examples 9–10)

A glass panel of the same dimensions and material as with Inventive Example 3 was treated with a mixed gas of a vapor of titanium isopropoxide, oxygen, and nitrogen to form a film of titanium oxide on the glass panel. A subsequent process is the same as with Inventive Example 3. A film of silicon oxide was formed on the above film, using a mixed gas of monosilane, etc., thereby forming a transparent thin film of two layers. The glass panel was annealed, taken out, and reheated to 600° C., after which a transparent conductive film of tin oxide was formed on the film of silicon oxide, using a mixed gas of a vapor of monobutyl tin trichloride, etc.

Then, an amorphous solar cell was fabricated according to the same process as with Inventive Example 1, and evaluated in the same manner as with Inventive Example 1. The results are shown in Table 1.

(Inventive Example 11)

A film of titanium oxide was formed on a glass panel in the same manner as with Inventive Examples 9–10. A subsequent process is the same as with Inventive Examples 4–5. A film of aluminum oxide was formed on the film of titanium oxide, using a mixed gas of aluminum isopropoxide, etc., thereby forming a transparent thin film of two layers. The glass panel was annealed, taken out, and reheated to 600° C., after which a transparent conductive film of tin oxide was formed on the film of aluminum oxide, using a mixed gas of a vapor of monobutyl tin trichloride, etc.

Then, an amorphous solar cell was fabricated according to the same process as with Inventive Example 1, and evaluated in the same manner as with Inventive Example 1. The results are shown in Table 1.

(Inventive Example 15, Inventive Example 18)

A transparent thin film of titanium oxide was formed on a glass panel in the same manner as with Inventive Examples 9–10. A subsequent process is the same as the process after the formation of the silicon oxide film in Inventive Example 3. The glass panel was annealed, taken out, and reheated to 600° C., after which a transparent conductive film of tin oxide was formed on the film of titanium oxide, using a mixed gas of a vapor of monobutyl tin trichloride, etc. The thickness of each of the films was controlled by changing the concentration of the material used.

Then, an amorphous solar cell was fabricated according to the same process as with Inventive Example 1, and evaluated in the same manner as with Inventive Example 1. The results of Inventive Example 15 are shown in Table 1, and the results of Inventive Example 18 are shown in Table 2.

(Inventive Examples 28, 30, 31, 33–39)

A glass panel of the same material and by the same manufacturing method as with Inventive Example 1 was treated with a mixed gas of a vapor of dimethyl tin dichloride, oxygen, water vapor, helium, and nitrogen to form a film of tin oxide on the glass panel according to the same process as with Inventive Example 1. A subsequent process is the same as with Inventive Example 1. A film of silicon oxide was formed on the above film, using a mixed gas of monosilane, thereby forming a transparent thin film of two layers. A transparent conductive film of tin oxide was formed on the film of silicon oxide, using a mixed gas of a vapor of dimethyl tin dichloride, etc.

The glass panel with these films formed thereon was cut according to the same process as with Inventive Example 1, and an amorphous silicon layer was formed. A zinc oxide layer was formed on the amorphous silicon layer according to a known sputtering process. On the zinc oxide layer thus formed, there was formed an Al layer as a reverse-side electrode according to the same process as with Inventive Example 1, thus fabricating a solar cell. The solar cell was evaluated in the same manner as with Inventive Example 1. The results are shown in Table 1.

(Inventive Examples 29, 32)

In the same manner as with Inventive Example 6, a tin oxide film, a silicon oxide film, and a tin oxide film were grown in the order named on the surface of a sheet of glass, thus forming a transparent thin film and a transparent conductive film. The sheet of glass with these films formed thereon was annealed and then cut to a glass panel having dimensions of 450 mm×450 mm.

A transparent film as a reflection reducing film for reducing the reflectivity was formed on the other surface of the glass panel remote from the transparent conductive film, as follows:

In Inventive Example 29, after the surface of the glass panel with the transparent conductive film formed thereon was masked, the glass panel was immersed for two hours in a saturated-silica aqueous solution of hydrosilicofluoric acid having a concentration of 1.25 moles/liter to which there were added 0.05 mole of boric acid and 0.008 mole of potassium fluoride. The glass panel was taken out, the mask was removed, and the glass panel was washed and dried to form a silicon oxide film on the other surface of the glass panel remote from the transparent conductive film. The silicon oxide film comprised a porous silicon oxide film having a substantial refractive index of 1.26 and had a thickness of 100 nm.

Then, an amorphous silicon layer was formed on the surface of the glass panel with the transparent conductive film formed thereon according to the same process as with Inventive Example 1. Then, a zinc oxide layer was formed on the amorphous silicon layer according to a known sputtering process. On the zinc oxide layer thus formed, there was formed an Al layer as a reverse-side electrode according to the same process as with Inventive Example 1, thus producing a solar cell. The solar cell was evaluated in the same manner as with Inventive Example 1. The results are shown in Table 1.

The visible light reflectivity of the glass panel (reflectivity of light which is applied to the surface with reflecting reducing film formed thereon) with the porous silicon oxide layer (reflecting reducing film) formed thereon was 5.5%, which was about 3.6% lower than before the reflecting reducing film was formed. The visible light reflectivity was measured by a spectrophotometer.

In Inventive Example 32, a mixed oxide film of titanium oxide and silicon oxide having a refractive index of 1.70 and a film thickness of 120 nm was formed on the glass surface according to a known sol-gel method, and a silicon oxide film having a refractive index of 1.46 and a film thickness of 90 nm was formed on the mixed oxide film according to a known sol-gel method.

Then, an amorphous silicon layer was formed on the surface of the glass panel with the transparent conductive film formed thereon according to the same process as with Inventive Example 1. A zinc oxide layer was formed on the amorphous silicon layer according to a known sputtering process. On the zinc oxide layer thus formed, there was formed an Al layer as a reverse-side electrode according to the same process as with Inventive Example 1, thus fabricating a solar cell. The solar cell was evaluated in the same manner as with Inventive Example.1. The results are shown in Table 1.

(Comparative Examples 1–2)

A transparent thin film of titanium oxide was formed on the glass panel using a mixed gas of titanium isopropoxide, etc. in the same manner as with Inventive Examples 9–10. A subsequent process is the same as the process after the formation of the silicon oxide film in Inventive Example 3. The glass panel was annealed, taken out, and reheated to 600° C., after which a transparent conductive film of tin oxide was formed on the titanium oxide film using a mixed gas of a vapor of monobutyl tin trichloride, etc. The thicknesses of the films of titanium oxide and tin oxide were controlled by changing the concentrations of the materials used.

Then, an amorphous solar cell was fabricated according to the same process as with Inventive Example 1, and evaluated in the same manner as with Inventive Example 1. The results are shown in Table 1.

(Comparative Example 3)

A glass panel of the same dimensions and material as with Inventive Example 3 was treated with a mixed gas of monosilane, oxygen, and nitrogen to form a film of silicon oxide on the glass panel according to the same process as with Inventive Example 3. A subsequent process is the same as with Comparative Examples 1–2. A film of titanium oxide was formed on the silicon oxide film, using a mixed gas of titanium isopropoxide, etc., thereby forming a transparent thin film of two layers. The glass panel was annealed, taken out, and reheated to 600° C., after which a transparent conductive film of tin oxide was formed on the film of titanium oxide, using a mixed gas of a vapor of monobutyl tin trichloride, etc.

Then, an amorphous solar cell was fabricated according to the same process as with Inventive Example 1, and evaluated in the same manner as with Inventive Example 1. The results are shown in Table 1.

(Comparative Example 4)

A glass panel of the same dimensions and material as with Inventive Example 3 was treated with a mixed gas of monosilane, oxygen, and nitrogen to form a film made primarily of silicon oxide on the glass panel according to the same process as with Inventive Example 3. A subsequent process is the same as with Comparative Examples 1–2. A film of titanium oxide was formed on the silicon oxide film, using a mixed gas of titanium isopropoxide, etc., thereby forming a transparent thin film of two layers. The glass panel was annealed, taken out, and reheated to 600° C., after which a transparent conductive film of tin oxide was formed on the film of titanium oxide, using a mixed gas of a vapor of monobutyl tin trichloride, etc.

Then, an amorphous solar cell was fabricated according to the same process as with Inventive Example 1 and evaluated in the same manner as with Inventive Example 1. The results are shown in Table 1.

(Comparative Example 5)

As with Inventive Example 8, a film of tin oxide was formed on a glass panel, using a mixed gas of a vapor of monobutyl tin trichloride, etc. A subsequent process is the same as with Comparative Examples 1–2. A film of titanium oxide was formed on the tin oxide film, using a mixed gas of titanium isopropoxide, etc., thereby forming a transparent thin film of two layers. The glass panel was annealed, taken out, and reheated to 600° C., after which a transparent conductive film of tin oxide was formed on the film of titanium oxide, using a mixed gas of a vapor of monobutyl tin trichloride, etc.

Then, an amorphous solar cell was fabricated according to the same process as with Inventive Example 1, and evaluated in the same manner as with Inventive Example 1. The results are shown in Table 1.

(Comparative Example 6)

A glass panel of the same dimensions and material as with Inventive Example 3 was treated with a mixed gas of a vapor of monobutyl tin trichloride, oxygen, water vapor, and nitrogen to form a film of tin oxide on the glass panel according to the same process as with Inventive Example 3. A subsequent process is the same as with Inventive Example 3. A film of silicon oxide was formed on the tin oxide film, using a mixed gas of monosilane, thereby forming a transparent thin film of two layers. The glass panel was annealed, taken out, and reheated to 600° C., after which a transparent conductive film of tin oxide was formed on the film of silicon oxide, using a mixed gas of a vapor of monobutyl tin trichloride, oxygen, nitrogen, and a small amount of water vapor.

Then, an amorphous solar cell was fabricated according to the same process as with Inventive Example 1, and evaluated in the same manner as with Inventive Example 1. The results are shown in Table 1.

(Comparative Example 7)

A glass panel of the same dimensions and material as with Inventive Example 3 was treated with a mixed gas of a vapor of monobutyl tin trichloride, oxygen, water vapor, nitrogen, and trifluoroacetate to form only a transparent conductive film of tin oxide on the glass panel according to the same process as with Inventive Example 3. Then, an amorphous-solar cell was fabricated according to the same process as with Inventive Example 1, and evaluated in the same manner as with Inventive Example 1. The results are shown in Table 1. Reflected color irregularities were located at several spots, and a reflected color was a reddish color.

The reddish color includes colors represented by +5<a*, −10<b*<+3 where a* and b* indicate chromaticness indexes in L*a*b* colorimetric system provided for according to JIS Z 8729-1980.

In Inventive Examples 1–15 and 25–36, there were almost no reflected color irregularities that can be recognized. In all comparative Examples 1–7, reflected color irregularities were located at several spots per square sample having a size of 430 mm×430 mm.

(Inventive Example 16)

As with Inventive Example 3, a transparent thin film of silicon oxide was formed, and a transparent conductive film of tin oxide was formed on the transparent thin film.

Then, an amorphous solar cell was fabricated according to the same process as with Inventive Example 1, and evaluated in the same manner as with Inventive Example 1. The results are shown in Table 2. A reflected color was a neutral color.

(Inventive Examples 19–20, Inventive Examples 23–24)

As with Inventive Example 15, a transparent thin film of titanium oxide was formed, and a transparent conductive film of tin oxide was formed on the transparent thin film.

Then, an amorphous solar cell was fabricated according to the same process as with Inventive Example 1, and evaluated in the same manner as with Inventive Example 1. The results are shown in Table 2. A reflected color was at least one of a neutral color and a greenish color.

(Inventive Examples 21, 22)

According to the same process as with Inventive Example 8, a film of tin oxide was formed, and a film of silicon oxide was formed on the film of tin oxide, thereby forming a transparent thin film of two layers. A transparent conductive film of tin oxide was formed on the transparent thin film. The thicknesses of the films of tin oxide and silicon oxide were adjusted by changing the concentrations of the materials used.

Then, an amorphous solar cell was fabricated according to the same process as with Inventive Example 1, and evaluated in the same manner as with Inventive Example 1. The results are shown in Table 2. In each of the samples, a reflected color was a neutral color.

(Inventive Examples 37–39)

According to the same process as with Inventive Example 1, a film of tin oxide was formed, and a film of silicon oxide was formed on the film of tin oxide, thereby forming a transparent thin film of two layers. A transparent conductive film of tin oxide was formed on the transparent thin film. The thicknesses of the films of tin oxide and silicon oxide were adjusted by changing the concentrations of the materials used.

Then, an amorphous solar cell was fabricated according to the same process as with Inventive Example 1, and evaluated in the same manner as with Inventive Example 1. The results are shown in Table 2. In each of the samples, a reflected color was a neutral color.

The results of the above examples will briefly be summarized below.

Inventive Examples 1–5:
Results: Since they satisfy the conditions of claims 1, 2, 3, 6, 13, 14, 15, 16, no reflected color irregularities were recognized.

Inventive Examples 6–11:
Results: Since they satisfy the conditions of claims 1, 5, 6, 7, 13, 14, 15, 16, no reflected color irregularities were recognized.

Inventive Examples 12–14:
Results: Since they satisfy the conditions of claims 1, 2, 31 7, 13, 14, 15, 16, no reflected color irregularities were recognized.

Inventive Example 15:
Results: Since it satisfies the conditions of claims 1, 7, 13, 14, 15, 16, no reflected color irregularities were recognized.

Inventive Examples 16–20:
Results: Since they satisfy the conditions of claims 6, 8, 9, 10, 13, a reflected color which was a neutral color or a greenish color was obtained.

Inventive Examples 21–22:
Results: Since they satisfy the conditions of claims 6, 8, 11, 12, 13, 14, 15, 16, a reflected color was a neutral color.

Inventive Examples 23–24:
Results: Since they satisfy the conditions of claims 6, 8, 9, 10, 13, 14, 15, 16, a reflected color was at least one of a neutral color and a greenish color even when the a—Si film thickness was varied. Inventive Examples 25–28, 30, 31, 33–36:
Results: Since they satisfy the conditions of claims 1, 4, 5, 14, 15, 16, no reflected color irregularities were recognized.

Inventive Examples 29, 32:
Results: Since they satisfy the conditions of claims 1, 4, 5, 14, 15, 16, 17, 18, 19, 20, no reflected color irregularities were recognized.

Inventive Examples 37–39:
Results: Since they satisfy the conditions of claims 8, 10, 11, 13, 14, 15, 16, a reflected color was a neutral color.

TABLE 1

| | 1st layer | | | 2nd layer | | | SnO$_2$ Film thickness range (mm) | a-Si Film thickness (mm) | Reflected color variation range | | Reflected color irregularities |
|---|---|---|---|---|---|---|---|---|---|---|---|
| | Metal oxide | Refractive Index | Film thickness (mm) | Metal oxide | Refractive index | Film thickness (mm) | | | a* | b* | |
| In. Ex. 1 | Si | 1.65 | 50 | | | | 550–650 | 350 | ±3.5 | ±2.0 | No |
| In. Ex. 2 | Si | 1.65 | 75 | | | | 540–660 | 350 | ±2.5 | ±2.0 | No |
| In. Ex. 3 | Si | 1.46 | 25 | | | | 650–750 | 350 | ±2.5 | ±2.5 | No |
| In. Ex. 4 | Al | 1.79 | 30 | | | | 650–750 | 350 | ±3.5 | ±2.0 | No |
| In. Ex. 5 | Al | 1.79 | 50 | | | | 540–660 | 350 | ±3.5 | ±1.5 | No |
| In. Ex. 6 | Sn | 2.02 | 25 | Si | 1.65 | 25 | 540–660 | 350 | ±3.0 | ±2.0 | No |
| In. Ex. 7 | Sn | 2.02 | 25 | Si | 1.65 | 50 | 540–660 | 350 | ±2.5 | ±3.5 | No |
| In. Ex. 8 | Sn | 2.02 | 25 | Si | 1.46 | 25 | 540–660 | 350 | ±2.0 | ±3.0 | No |
| In. | Ti | 2.37 | 15 | Si | 1.65 | 25 | 540–660 | 350 | ±4.0 | ±4.0 | No |

TABLE 1-continued

| | 1st layer | | | 2nd layer | | | SnO$_2$ Film thickness range (mm) | a-Si Film thickness (mm) | Reflected color variation range | | Reflected color irregularities |
|---|---|---|---|---|---|---|---|---|---|---|---|
| | Metal oxide | Refractive Index | Film thickness (mm) | Metal oxide | Refractive index | Film thickness (mm) | | | a* | b* | |
| In. Ex. 9 | Ti | 2.37 | 15 | Si | 1.46 | 25 | 540–660 | 350 | ±3.0 | ±4.0 | No |
| In. Ex. 10 | Ti | 2.37 | 15 | Al | 1.79 | 20 | 650–750 | 350 | ±4.5 | ±4.0 | No |
| In. Ex. 11 | Si | 1.46 | 20 | | | | 900–1100 | 350 | ±2.0 | ±1.5 | No |
| In. Ex. 12 | Si | 1.46 | 60 | | | | 900–1100 | 350 | ±2.0 | ±1.5 | No |
| In. Ex. 13 | Si | 1.65 | 30 | | | | 900–1100 | 350 | ±2.0 | ±1.5 | No |
| In. Ex. 14 | Ti | 2.37 | 20 | | | | 900–1100 | 350 | ±2.5 | ±2.5 | No |
| In. Ex. 15 | Sn | 1.90 | 30 | Si | 1.46 | 15 | 680–820 | 340 | ±2.5 | ±1.0 | No |
| In. Ex. 25 | Sn | 1.90 | 35 | Si | 1.46 | 20 | 700–840 | 340 | ±2.0 | ±1.5 | No |
| In. Ex. 26 | Sn | 1.90 | 40 | Si | 1.46 | 30 | 770–930 | 340 | ±2.5 | ±1.5 | No |
| In. Ex. 27 | Sn | 1.90 | 25 | Si | 1.46 | 15 | 650–790 | 340 | ±2.5 | ±1.0 | No |
| In. Ex. 28 | Sn | 1.90 | 30 | Si | 1.46 | 15 | 770–930 | 340 | ±1.5 | ±1.0 | No |
| In. Ex. 29 | Sn | 1.90 | 30 | Si | 1.46 | 20 | 680–820 | 340 | ±1.5 | ±1.5 | No |
| In. Ex. 30 | Sn | 1.90 | 35 | Si | 1.46 | 15 | 680–820 | 340 | ±1.5 | ±1.0 | No |
| In. Ex. 31 | Sn | 1.90 | 35 | Si | 1.46 | 20 | 770–930 | 340 | ±1.5 | ±1.0 | No |
| In. Ex. 32 | Sn | 1.90 | 35 | Si | 1.46 | 25 | 680–820 | 340 | ±1.5 | ±1.0 | No |
| In. Ex. 33 | Sn | 1.90 | 40 | Si | 1.46 | 20 | 770–930 | 340 | ±1.5 | ±1.0 | No |
| In. Ex. 34 | Sn | 1.90 | 40 | Si | 1.46 | 25 | 700–840 | 340 | ±2.0 | ±1.5 | No |
| In. Ex. 35 | Sn | 1.90 | 50 | Si | 1.46 | 20 | 700–840 | 340 | ±2.5 | ±1.5 | No |
| Co. Ex. 1 | Ti | 2.37 | 25 | | | | 540–660 | 350 | ±8.0 | ±5.5 | Yes |
| Co. Ex. 2 | Ti | 2.37 | 50 | | | | 540–660 | 350 | ±10.5 | ±4.0 | Yes |
| Co. Ex. 3 | Si | 1.46 | 25 | Ti | 2.37 | 25 | 540–660 | 350 | ±8.0 | ±5.5 | Yes |
| Co. Ex. 4 | Si | 1.65 | 25 | Ti | 2.37 | 25 | 540–660 | 350 | ±8.5 | ±5.5 | Yes |
| Co. Ex. 5 | Sn | 2.02 | 25 | Ti | 2.37 | 25 | 540–660 | 350 | ±8.5 | ±5.5 | Yes |
| Co. Ex. 6 | Sn | 1.90 | 50 | Si | 1.46 | 45 | 540–660 | 340 | ±6.5 | ±5.5 | Yes |
| Co. Ex. 7 | — | | | — | | | 540–660 | 350 | ±11.0 | ±5.5 | Yes |

(Note) Si, Ti, Sn, Al in the column "metal oxide" in Table 1 represent silicon oxide, titanium oxide, tin oxide, and aluminum oxide, respectively.

TABLE 2

| | 1st layer | | | 2nd layer | | | SnO$_2$ Film thickness range (mm) | a-Si Film thickness (mm) | Reflected color |
|---|---|---|---|---|---|---|---|---|---|
| | Metal oxide | Refractive Index | Film thickness (mm) | Metal oxide | Refractive index | Film thickness (mm) | | | |
| In. Ex. 16 | Si | 1.46 | 75 | | | | 690–720 | 500 | Neutral |
| In. Ex. 17 | Si | 1.65 | 25 | | | | 500–540 | 500 | Neutral |
| In. | Ti | 2.37 | 25 | | | | 630–670 | 500 | Neutral |

TABLE 2-continued

| | 1st layer | | | 2nd layer | | | SnO₂ Film | a-Si | |
|---|---|---|---|---|---|---|---|---|---|
| | Metal oxide | Refractive Index | Film thickness (nm) | Metal oxide | Refractive index | Film thickness (nm) | thickness range (nm) | Film thickness (nm) | Reflected color |
| Ex. 18 In. | Ti | 2.37 | 50 | | | | 600–640 | 500 | Greenish |
| Ex. 19 In. | Ti | 2.37 | 75 | | | | 580–630 | 500 | Greenish |
| Ex. 20 In. | Sn | 2.02 | 25 | Si | 1.65 | 75 | 540–570 | 500 | Neutral |
| Ex. 21 In. | Sn | 2.02 | 75 | Si | 1.65 | 25 | 550–610 | 500 | Neutral |
| Ex. 22 In. | Ti | 2.37 | 50 | | | | 600–650 | 600 | Neutral Greenish |
| Ex. 23 In. | Ti | 2.37 | 75 | | | | 590–620 | 600 | Greenish |
| Ex. 24 In. | Sn | 1.90 | 35 | Si | 1.46 | 15 | 770–930 | 340 | Neutral |
| Ex. 37 In. | Sn | 1.90 | 40 | Si | 1.46 | 15 | 770–930 | 340 | Neutral |
| Ex. 38 In. | Sn | 1.90 | 35 | Si | 1.46 | 20 | 770–930 | 340 | Neutral |
| Co. Ex. 7 | — | | | | | | 540–660 | 350 | Reddish |

(Note) Si, Ti, Sn in the column "metal oxide" in Table 2 represent silicon oxide, titanium oxide, and tin oxide, respectively.

TABLE 3

| | SnO₂ Cl concentration (wt %) | SnO₂ F concentration (wt %) |
|---|---|---|
| In. Ex. 1 | 0.02 | 0.07 |
| In. Ex. 2 | 0.03 | 0.06 |
| In. Ex. 3 | 0.03 | 0.09 |
| In. Ex. 4 | 0.03 | 0.08 |
| In. Ex. 5 | 0.02 | 0.07 |
| In. Ex. 6 | 0.04 | 0.08 |
| In. Ex. 7 | 0.03 | 0.07 |
| In. Ex. 8 | 0.02 | 0.07 |
| In. Ex. 9 | 0.03 | 0.08 |
| In. Ex. 10 | 0.02 | 0.06 |
| In. Ex. 11 | 0.07 | 0.09 |
| In. Ex. 12 | 0.03 | 0.06 |
| In. Ex. 13 | 0.09 | 0.11 |
| In. Ex. 14 | 0.02 | 0.05 |
| In. Ex. 15 | 0.03 | 0.07 |
| In. Ex. 16 | 0.04 | 0.08 |
| In. Ex. 17 | 0.03 | 0.07 |
| In. Ex. 18 | 0.04 | 0.08 |
| In. Ex. 19 | 0.03 | 0.07 |
| In. Ex. 20 | 0.03 | 0.07 |
| In. Ex. 21 | 0.03 | 0.07 |
| In. Ex. 22 | 0.04 | 0.08 |
| In. Ex. 23 | 0.02 | 0.06 |
| In. Ex. 24 | 0.03 | 0.08 |
| In. Ex. 25 | 0.01 | 0.04 |
| In. Ex. 26 | 0.01 | 0.05 |
| In. Ex. 27 | 0.01 | 0.05 |
| In. Ex. 28 | 0.02 | 0.08 |
| In. Ex. 29 | 0.02 | 0.07 |
| In. Ex. 30 | 0.02 | 0.08 |
| In. Ex. 31 | 0.02 | 0.07 |
| In. Ex. 32 | 0.02 | 0.06 |
| In. Ex. 33 | 0.02 | 0.04 |
| In. Ex. 34 | 0.02 | 0.04 |
| In. Ex. 35 | 0.05 | 0.07 |
| In. Ex. 36 | 0.04 | 0.06 |
| In. Ex. 37 | 0.02 | 0.07 |
| In. Ex. 38 | 0.03 | 0.07 |
| In. Ex. 39 | 0.03 | 0.07 |
| Co. Ex. 1 | 0.08 | 0.10 |
| Co. Ex. 2 | 0.03 | 0.08 |
| Co. Ex. 3 | 0.03 | 0.07 |
| Co. Ex. 4 | 0.06 | 0.08 |
| Co. Ex. 5 | 0.07 | 0.09 |
| Co. Ex. 6 | 0.12 | 0.08 |
| Co. Ex. 7 | 0.06 | 0.08 |

INDUSTRIAL APPLICABILITY

According to the present invention, there is provided an inexpensive amorphous silicon solar cell which suffers less reflected color irregularities even on a large area thereof for use on house roofs and walls, and exhibits a reflected color which is a neutral color or a greenish color, rather than a normal color range from red to reddish purple.

What is claimed is:

1. A photovoltaic device comprising a transparent conductive film, a semiconductor thin film, and a metallic electrode film successively deposited on one surface of a transparent substrate, characterized in that, the thickness distribution of said transparent conductive film is in a range of ±10% of a central film thickness, a transparent thin film comprising at least one layer and having a refractive index ranging from 1.45 to 1.8 and a thickness ranging from 20 to 80 nm is deposited between said transparent substrate and said transparent conductive film, and a* and b* of a reflected color from the transparent substrate to which light is applied may vary within a range of ±5 of a* and b*, where a* and b* indicate chromaticness indexes in L*a*b* colorimetric system provided for according to JIS Z 8729-1980.

2. A photovoltaic device according to claim 1, wherein said transparent thin film is primarily made of silicon oxide or aluminum oxide.

3. A photovoltaic device according to claim 1, wherein said transparent conductive film has a thickness ranging smaller than 800 nm.

4. A photovoltaic device according to claim 1, wherein said transparent conductive film has a thickness ranging from 800 to 1500 nm.

5. A photovoltaic device according to claim 1, wherein said transparent conductive film is primarily made of tin oxide.

6. A photovoltaic device according to claim 5, wherein said transparent conductive film contains at least one of fluorine, chlorine, or antimony.

7. A photovoltaic device according to claim 6, wherein said transparent conductive film contains 0.11 weight % or less of chlorine and fluorine having a concentration equal to or greater than the concentration of chlorine.

8. A photovoltaic device according to claim 1, wherein a transparent film of at least one layer is formed on a surface of said transparent substrate remote from the transparent conductive film, and the reflectivity of the transparent substrate closer to the transparent film is smaller than the reflectivity of the transparent substrate which is free of said transparent film, in the absence of said semiconductor thin film and said metallic electrode film.

9. A photovoltaic device according to 8, wherein said transparent film has a refractive index ranging from 1.25 to 1.35 and a thickness ranging from 50 to 200 nm or a refractive index ranging from 1.35 to 1.50 and a thickness ranging from 45 to 190 nm.

10. A photovoltaic device according to 8, wherein said transparent film comprises a two-layer film, and the refractive index of the transparent film closer to said transparent substrate is greater than the refractive index of the transparent film formed thereon.

11. A photovoltaic device according to 10, wherein the transparent film closer to said transparent substrate has a refractive index ranging from 1.6 to 2.0 and a thickness ranging from 50 to 200 nm, and the transparent film formed thereon has a refractive index ranging from 1.25 to 1.8 and a thickness ranging from 30 to 150 nm.

12. A photovoltaic device according to claim 1, wherein said semiconductor thin film contains amorphous silicon.

13. A photovoltaic device comprising a transparent conductive film, a semiconductor thin film, and a metallic electrode film successively deposited on one surface of a transparent substrate, characterized in that, the thickness distribution of said transparent conductive film is in a range of ±10% of a central film thickness, a transparent thin film is deposited between said transparent substrate and said transparent conductive film, said transparent thin film comprises a first layer and a second layer, the first layer thin film positioned closer to said transparent substrate has a refractive index ranging from 1.8 to 2.5 and a thickness ranging from 10 to 50 nm and a second layer thin film deposited on the first layer thin film has a refractive index ranging from 1.45 to 1.8 and a thickness ranging from 10 to 50 nm, and a* and b* of a reflected color from the transparent substrate to which light is applied varies within a range of ±5 of a* and b*, where a* and b* indicate chromaticness indexes in L*a*b* colorimetric system provided for according to JIS Z 8729-1980.

14. A photovoltaic device according to claim 13, wherein said first layer thin film is primarily made of tin oxide or titanium oxide, and said second layer thin film is primarily made of silicon oxide or aluminum oxide.

15. A photovoltaic device according to claim 13, wherein said transparent conductive film has a thickness smaller than 800 nm.

16. A photovoltaic device according to claim 13, wherein said transparent conductive film has a thickness ranging from 800 to 1500 nm.

17. A photovoltaic device according to claim 13, wherein said transparent conductive film is primarily made of tin oxide.

18. A photovoltaic device according to claim 13, wherein a transparent film of at least one layer is formed on a surface of said transparent substrate remote from the transparent conductive film, and the reflectivity of the transparent substrate closer to the transparent film is smaller than a reflectivity of the transparent substrate which is free of said transparent film, in the absence of said semiconductor thin film and said metallic electrode film.

19. A photovoltaic device according to claim 13, wherein said semiconductor thin film contains amorphous silicon.

20. A photovoltaic device comprising a transparent conductive film, a semiconductor thin film, and a metallic electrode film successively deposited on one surface of a transparent substrate characterized in that, a transparent thin film comprising at least one layer is deposited between said transparent substrate and said transparent conductive film, and a reflected color as seen from the transparent substrate to which light is applied includes at least one of a neutral color and a greenish color, wherein said transparent thin film comprises a first layer and a second layer, the first layer thin film positioned closer to said transparent substrate has a refractive index ranging from 1.8 to 2.5 and a thickness ranging from 15 to 100 nm, and the second layer thin film deposited on the first layer thin film has a refractive index ranging from 1.45 to 1.8 and a thickness ranging from 15 to 100 nm.

21. A photovoltaic device according to claim 20, wherein said first layer thin film is primarily made of tin oxide or titanium oxide, and said second layer thin film is primarily made of silicon oxide or aluminum oxide.

22. A photovoltaic device according to claim 20 wherein said transparent conductive film is primarily made of tin oxide, contains at least one of chloride, fluorine or antimony and the concentration of chlorine ranges from 0.005 to 0.11 weight % and the concentration of fluorine ranges from 0.001 to 0.7 weight %.

23. A photovoltaic device according to claim 20, wherein said transparent conductive film is primarily made of tin oxide.

24. A photovoltaic device according to claim 20, wherein a transparent film of at least one layer is formed on a surface of said transparent substrate remote from the transparent conductive film, and the reflectivity of the transparent substrate closer to the transparent film is smaller than the reflectivity of the transparent substrate which is free of said transparent film, in the absence of said semiconductor thin film and said metallic electrode film.

25. A photovoltaic device according to claim 20, wherein said semiconductor thin film contains amorphous silicon.

* * * * *